United States Patent
Yamakawa et al.

(10) Patent No.: US 9,509,270 B2
(45) Date of Patent: Nov. 29, 2016

(54) NOISE CANCELLATION RESONATOR

(71) Applicant: EQUOS RESEARCH CO., LTD., Chiyoda-ku, Tokyo (JP)

(72) Inventors: Hiroyuki Yamakawa, Hokkaido (JP); Kenichiro Sato, Tokyo (JP)

(73) Assignee: EQUOS RESEARCH CO., LTD., Tokyo (JP)

( * ) Notice: Subject to any disclaimer, the term of this patent is extended or adjusted under 35 U.S.C. 154(b) by 0 days.

(21) Appl. No.: 14/436,620

(22) PCT Filed: Jan. 29, 2014

(86) PCT No.: PCT/JP2014/051974
§ 371 (c)(1),
(2) Date: Apr. 17, 2015

(87) PCT Pub. No.: WO2014/119619
PCT Pub. Date: Aug. 7, 2014

(65) Prior Publication Data
US 2016/0173051 A1   Jun. 16, 2016

(30) Foreign Application Priority Data

Jan. 31, 2013   (JP) ................................ 2013-016778

(51) Int. Cl.
*H03H 7/01* (2006.01)
*H01F 38/14* (2006.01)
(Continued)

(52) U.S. Cl.
CPC ............ *H03H 7/0115* (2013.01); *H01F 38/14* (2013.01); *H02J 50/10* (2016.02); *H01F 27/38* (2013.01); *H03H 7/09* (2013.01); *H03H 2007/013* (2013.01)

(58) Field of Classification Search
CPC ................ H02J 7/00; H02J 7/02; H02J 7/04; G08C 17/00; G08C 17/02; G08C 19/12; H01F 38/14

USPC .......................................... 333/24 R, 176, 12
See application file for complete search history.

(56) References Cited

U.S. PATENT DOCUMENTS 7,038,470 B1 * 5/2006 Johnson ............... G01N 33/383
                                                      250/390.05
8,248,027 B2 * 8/2012 Sakoda ................... H02J 5/005
                                                      307/104

(Continued)

FOREIGN PATENT DOCUMENTS

JP   2009-501510 A    1/2009
JP   2009-135346 A    6/2009

(Continued)

OTHER PUBLICATIONS

Harvey Lenpamer, RFID Design Principles, Artech House, 2012, 71 pages.*

(Continued)

*Primary Examiner* — Dean Takaoka
(74) *Attorney, Agent, or Firm* — Oliff PLC

(57) ABSTRACT

In order to provide a noise cancellation resonator that is highly effective in reducing noise, a noise cancellation resonator of the present invention is characterized by including: a noise cancellation resonator coil with an inductance component of $L_n$; and a noise cancellation resonator capacitor with a capacitance component of $C_n$, wherein the noise cancellation resonator has a resonance frequency that is calculated by adding a shift frequency that is determined based on a degree of coupling between a main resonator coil and the noise cancellation resonator coil, to a predetermined frequency of an electromagnetic field generated by a main resonator that is a source of noise and includes the main resonator coil.

8 Claims, 4 Drawing Sheets

(51) Int. Cl.
*H04B 15/00* (2006.01)
*H01F 27/38* (2006.01)
*H03H 7/09* (2006.01)

(56) References Cited

U.S. PATENT DOCUMENTS

| | | | | |
|---|---|---|---|---|
| 9,126,490 B2* | 9/2015 | Cook | ................... | B60L 11/182 |
| 2007/0222542 A1 | 9/2007 | Joannopoulos et al. | | |
| 2008/0238364 A1* | 10/2008 | Weber | ...................... | H02J 7/025 |
| | | | | 320/108 |
| 2010/0148723 A1* | 6/2010 | Cook | ................... | G06K 7/0008 |
| | | | | 320/108 |
| 2010/0190435 A1* | 7/2010 | Cook | ...................... | H02J 5/005 |
| | | | | 455/41.1 |
| 2011/0101792 A1 | 5/2011 | Koumoto | | |
| 2011/0101996 A1* | 5/2011 | Potyrailo | ................ | G01D 21/00 |
| | | | | 324/655 |
| 2011/0193417 A1 | 8/2011 | Hirasaka et al. | | |
| 2012/0242447 A1* | 9/2012 | Ichikawa | .............. | B60L 11/182 |
| | | | | 336/84 C |
| 2012/0306609 A1 | 12/2012 | Kato | | |
| 2013/0009650 A1* | 1/2013 | Sakakibara | ............... | B60L 3/00 |
| | | | | 324/546 |
| 2013/0038135 A1* | 2/2013 | Ichikawa | .............. | B60L 11/182 |
| | | | | 307/104 |
| 2013/0038281 A1* | 2/2013 | Sakakibara | ............. | B60L 5/005 |
| | | | | 320/108 |
| 2014/0015329 A1* | 1/2014 | Widmer | ............... | G01D 5/2006 |
| | | | | 307/104 |
| 2014/0347017 A1* | 11/2014 | Sugano | ................... | B60L 1/003 |
| | | | | 320/137 |
| 2015/0123485 A1* | 5/2015 | Yamakawa | ............... | H01F 3/10 |
| | | | | 307/104 |
| 2015/0137612 A1* | 5/2015 | Yamakawa | ............. | H01F 38/14 |
| | | | | 307/104 |
| 2015/0180285 A1* | 6/2015 | Yamakawa | ........... | B60L 11/182 |
| | | | | 307/104 |
| 2016/0187519 A1* | 6/2016 | Widmer | ................... | G01V 3/10 |
| | | | | 324/222 |

FOREIGN PATENT DOCUMENTS

| | | |
|---|---|---|
| JP | 2010-087024 A | 4/2010 |
| JP | 2010-098807 A | 4/2010 |
| JP | 2013-012702 A | 1/2013 |
| WO | 2007/008646 A2 | 1/2007 |
| WO | 2010/001540 A1 | 1/2010 |

OTHER PUBLICATIONS

Feb. 25, 2014 International Search Report issued in International Patent Application No. PCT/JP2014/051974.

Aug. 10, 2016 European Search Report issued in European Patent Application No. 14745889.7.

* cited by examiner

Schematic diagram showing state of current and
magnetic field at first extreme-value frequency
(magnetic wall condition coupling frequency)

Schematic diagram showing state of current and
magnetic field at second extreme-value frequency
(electric wall condition coupling frequency)

(A)

(B)

NOISE CANCELLATION RESONATOR

TECHNICAL FIELD

The present invention relates to a noise cancellation resonator that is suitably used to reduce noise emitted from a wireless power transmission system that uses a magnetic resonance antenna of a magnetic resonance method.

BACKGROUND ART

In recent years, development of technology for wirelessly transmitting power (electric energy) without using power cords and the like has been popular. Among the methods of wirelessly transmitting power, a so-called magnetic resonance method is the technology that has been attracting particular attention. The magnetic resonance method was proposed by a research group at the Massachusetts Institute of Technology in 2007. The relevant technique has been disclosed in Patent Document 1 (Jpn. PCT National Publication No. 2009-501510), for example.

In a wireless power transmission system of the magnetic resonance method, the resonance frequency of a power transmission-side antenna is equal to the resonance frequency of a power reception-side antenna. Accordingly, the energy is transmitted from the power transmission-side antenna to the power reception-side antenna in an efficient manner. One of the major features is the power transmission distance that can be set to between several tens of centimeters and several meters.

If the above-described wireless power transmission system of the magnetic resonance method is used in a power supply station for such vehicles as electric cars, a power reception-side antenna may be mounted in a bottom portion of a vehicle, and power may be supplied to the power reception-side antenna from a power transmission-side antenna that is buried in the ground. In cases where power is transmitted in that manner, it is difficult for the power transmission-side antenna to be completely and electromagnetically coupled to the power reception-side antenna. Some noise would emerge as the noise is emitted from the antennas, possibly leading to a rise in the temperature of the metal used in the bottom portion of the vehicle body and the like.

Accordingly, a study needs to be done to look into ways to reduce the noise generated from the antennas in the wireless power transmission system.

Incidentally, as a technique for reducing high-frequency noise, for example, Patent Document 2 (JP2010-87024A) discloses a resonant circuit including a conductor, which is provided near a source of noise in such a way as to have a looped closed path, and a capacitor, which is electrically connected to the closed path.

[Patent Document 1]
Jpn. PCT National Publication No. 2009-501510
[Patent Document 2]
JP2010-87024A

SUMMARY OF THE INVENTION

Problems to be Solved by the Invention

According to the prior art disclosed in Patent Document 2, the resonance frequency of a noise-cancelling LC resonator is set equal to the frequency of the source of noise that should be canceled, in order to increase the effect of noise reduction.

However, the problem is that, even if the resonance frequency of the noise cancellation resonator is set equal to the frequency of the noise source, this setting may not be enough to reduce noise significantly, particularly as a measure to deal with noise in the wireless power transmission system that uses the magnetic resonance antenna of the magnetic resonance method.

Means for Solving the Problems

To solve the problems, a noise cancellation resonator of the present invention is characterized by including: a noise cancellation resonator coil with an inductance component of $L_n$; and a noise cancellation resonator capacitor with a capacitance component of $C_n$, wherein the noise cancellation resonator has a resonance frequency that is calculated by adding a shift frequency that is determined based on a degree of coupling between a main resonator coil and the noise cancellation resonator coil, to a predetermined frequency of an electromagnetic field generated by a main resonator that is a source of noise and includes the main resonator coil.

The noise cancellation resonator of the present invention is characterized in that the predetermined frequency is a frequency of a fundamental wave of the electromagnetic field generated by the main resonator.

The noise cancellation resonator of the present invention is characterized in that the predetermined frequency is a frequency of a higher harmonic wave of the electromagnetic field generated by the main resonator.

The noise cancellation resonator of the present invention is characterized in that the higher harmonic wave is an odd-multiple wave.

The noise cancellation resonator of the present invention is characterized in that the higher harmonic wave is an even-multiple wave.

The noise cancellation resonator of the present invention is characterized in that
if a mutual inductance component between the main resonator coil and the noise cancellation resonator coil is represented by $L_m$, the shift frequency is:

[Formula 1]

$$f_s = \frac{1}{2\pi\sqrt{L_m C_n}}.$$

The noise cancellation resonator of the present invention is characterized in that the main resonator is an antenna that is used to transmit power.

The noise cancellation resonator of the present invention is characterized in that a Q-value is 50 or more.

Advantages of the Invention

The noise cancellation resonator of the present invention is characterized by having a resonance frequency that is calculated by adding a shift frequency, which is determined based on the degree of coupling between the main resonator coil and the noise cancellation resonator coil, to a predetermined frequency of an electromagnetic field generated by the main resonator that is a source of noise and includes the main resonator coil. Therefore, the noise cancellation resonator of the present invention is highly effective in reducing noise, particularly as a measure to deal with noise in the wireless power transmission system that uses the magnetic resonance antenna of the magnetic resonance method.

BEST MODE FOR CARRYING OUT THE INVENTION

Hereinafter, an embodiment of the present invention will be described with reference to the accompanying drawings. Incidentally, a noise cancellation resonator 300 of the present invention is particularly suitable for dealing with noise in a wireless power transmission system that uses a magnetic resonance antenna of a magnetic resonance method. However, the present invention is not limited to such noise sources as the above power transmission system. The present invention can improve the effect of noise reduction for various noise sources.

Figure 1:
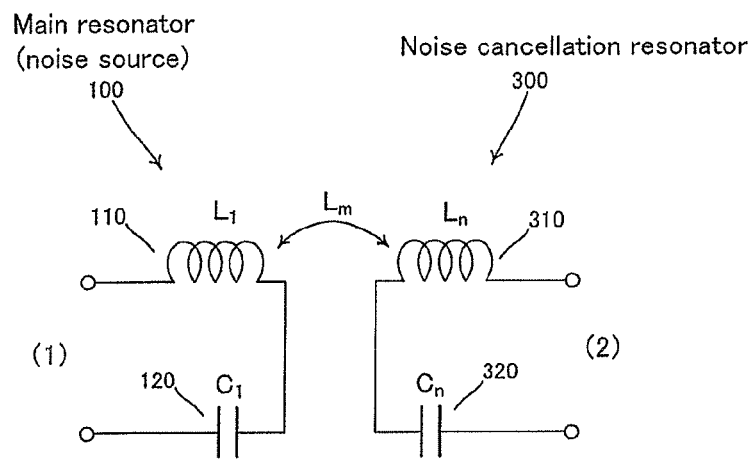
FIG. 1 is a diagram for explaining the coupling between a noise cancellation resonator and a main resonator, which is a source of noise, according to an embodiment of the present invention.

FIG. 1 is a diagram for explaining the coupling between the noise cancellation resonator 300 and a main resonator 100, which is a source of noise, according to an embodiment of the present invention.

In FIG. 1, the main resonator 100 is used as a power transmission antenna of the power transmission system. The main resonator 100 generates an electromagnetic field of a predetermined fundamental frequency. It is expected that the main resonator 100 will transmit power to a power reception sub-resonator, not shown, by using the magnetic resonance method.

The main resonator 100 includes a main resonator coil 110 with an inductance component of $L_1$, and a main resonator capacitor 120 with a capacitance component of $C_1$, in such a way that the main resonator coil 110 and the main resonator capacitor 120 are connected in series.

The noise cancellation resonator 300 includes a noise cancellation resonator coil 310 with an inductance component of $L_n$, and a noise cancellation resonator capacitor 320 with a capacitance component of $C_n$, in such a way that the noise cancellation resonator coil 310 and the noise cancellation resonator capacitor 320 are connected in series. The noise cancellation resonator 300 does not contribute to the transmission of power to the sub-resonator. It is expected that the noise cancellation resonator 300 will cancel electromagnetic fields (noise) that leak from the main resonator 100.

The mutual inductance between the main resonator coil 110 and the noise cancellation resonator coil 310 is represented by $L_m$.

The noise cancellation resonator 300 is actually closed in a terminal section (2). However, in FIG. 1, the noise cancellation resonator 300 is recognized as a power transmission circuit from the main resonator 100 to the noise cancellation resonator 300. In this manner, the characteristics of the noise cancellation resonator 300 will be described.

Figure 2:
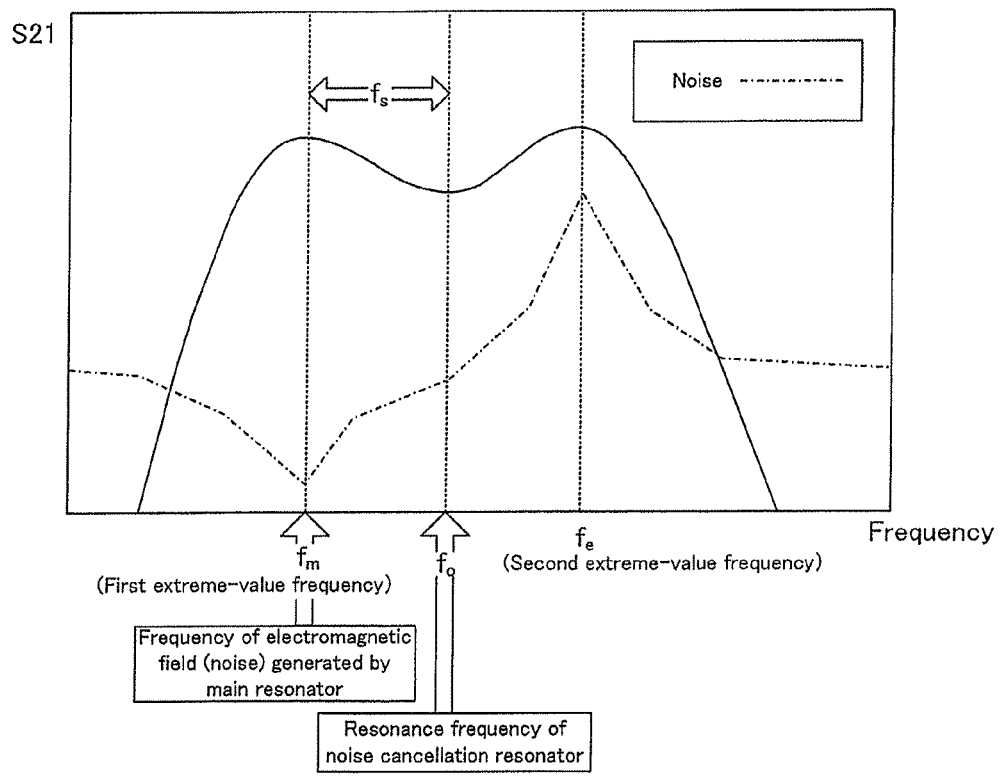
FIG. 2 is a diagram showing frequency dependence of transmission efficiency, with a diagram of frequency dependence of noise emissivity superimposed thereon.

FIG. 2 is a diagram showing frequency dependence of the transmission efficiency of the above power transmission circuit of FIG. 1, with a diagram of frequency dependence and noise emissivity superimposed thereon. In FIG. 2, the horizontal axis represents frequency; S21 on the vertical axis represents the power that passes through the terminal (2) at a time when a signal is input through terminal (1).

As shown in FIG. 2, in the case of the frequency characteristics of the power transmission efficiency of the power transmission circuit of FIG. 1, there are two frequencies that give two extreme values. The extreme-value frequency that is lower in frequency is defined as a first extreme-value frequency, and the extreme-value frequency that is higher in frequency is defined as a second extreme-value frequency. Moreover, in the diagram, the resonance frequency of the noise cancellation resonator 300 is represented by $f_o$.

When the first extreme-value frequency, which is an extreme-value frequency that is lower in frequency, is used to drive the main resonator 100 during the transmission of power, the main resonator coil 110 of the main resonator 100 is coupled to the noise cancellation resonator coil 310 of the noise cancellation resonator 300 under a magnetic wall condition.

When the second extreme-value frequency, which is an extreme-value frequency that is higher in frequency, is used to drive the main resonator 100 during the transmission of power, the main resonator coil 110 of the main resonator 100 is coupled to the noise cancellation resonator coil 310 of the noise cancellation resonator 300 under an electric wall condition.

The concept of electric and magnetic walls that emerge on a symmetry plane between the main resonator coil 110 of the main resonator 100 and the noise cancellation resonator coil 310 of the noise cancellation resonator 300 will be described.

Figure 3:
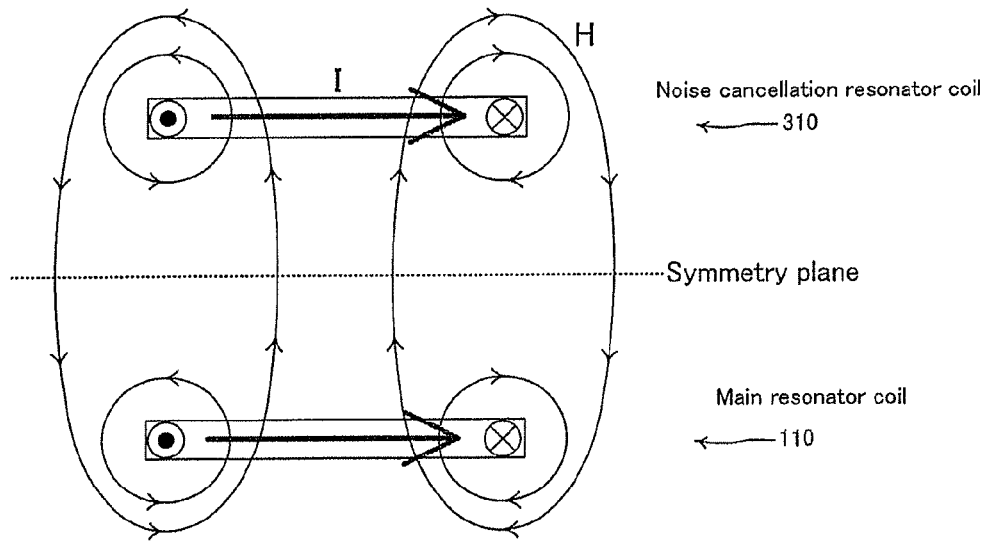
FIG. 3 is a schematic diagram showing the state of current and electric field at a first extreme-value frequency (magnetic wall condition coupling frequency).

FIG. 3 is a schematic diagram showing the state of current and electric field at the first extreme-value frequency (magnetic wall condition coupling frequency). At the first extreme-value frequency, the phase of current flowing through the main resonator coil 110 is substantially equal to the phase of current flowing through the noise cancellation resonator coil 310. A position where magnetic field vectors are aligned is near a central portion of the main resonator coil 110 or noise cancellation resonator coil 310. Suppose that, in this situation, a magnetic wall has emerged in such a way that the direction of magnetic field is perpendicular with respect to the symmetry plane between the main resonator coil 110 and the noise cancellation resonator coil 310.

As shown in FIG. 3, when the main resonator 100 is coupled to the noise cancellation resonator 300 under the magnetic wall condition, a magnetic field from the main resonator coil 110 gets into the noise cancellation resonator coil 310.

Figure 4:
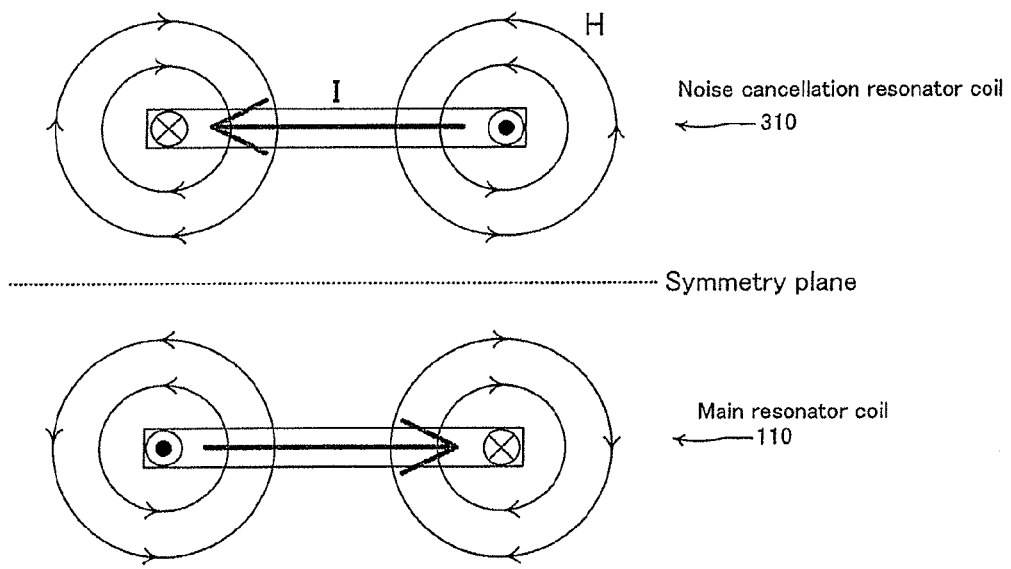
FIG. 4 is a schematic diagram showing the state of current and electric field at a second extreme-value frequency (electric wall condition coupling frequency).

FIG. 4 is a schematic diagram showing the state of current and electric field at the second extreme-value frequency (electric wall condition coupling frequency). At the second extreme-value frequency, the phase of current flowing through the main resonator coil 110 is almost opposite to the phase of current flowing through the noise cancellation resonator coil 310. A position where magnetic field vectors are aligned is near the symmetry plane of the main resonator coil 110 or noise cancellation resonator coil 310. Suppose that, in this situation, an electric wall has emerged in such a way that the direction of magnetic field is horizontal with respect to the symmetry plane between the main resonator coil 110 and the noise cancellation resonator coil 310.

As shown in FIG. 4, when the main resonator 100 is coupled to the noise cancellation resonator 300 under the electric wall condition, a magnetic field from the main resonator coil 110 and a magnetic field from the noise cancellation resonator 300 exclude each other at the symmetry plane.

Incidentally, as for the above-described concept of electric and magnetic walls and the like, the following documents are incorporated herein by reference: Takehiro Imura, Yoichi Hori, "Transmission technology with electromagnetic field resonant coupling," IEEJ Journal, Vol. 129, No. 7, 2009; Takehiro Imura, Hiroyuki Okabe, Toshiyuki Uchida, Youich Hori, "Research on magnetic field coupling and electric field coupling of non-contact power transmission in terms of equivalent circuits," IEEJ Trans. IA, Vol. 130, No. 1, 2010; and other documents.

In this case, as for the frequency characteristics of the noise emitted from the main resonator 100, as indicated by dashed line in FIG. 2, it is clear that a minimum value emerges at the first extreme-value frequency (magnetic wall condition coupling frequency), and that a maximum value emerges at the second extreme-value frequency (electric wall condition coupling frequency).

According to the present invention, given the above characteristics, the resonance frequency $f_c$ of the noise cancellation resonator 300 is set in such a way that the frequency of electromagnetic field (noise) emitted from the main resonator 100 becomes equal to the first extreme-value frequency $f_m$ (magnetic wall condition coupling frequency).

More specifically, the resonance frequency $f_c$ of the noise cancellation resonator 300 is set to a resonance frequency that is calculated by adding a shift frequency $f_s$, which is determined based on the degree of coupling (K) between the main resonator coil 110 and the noise cancellation resonator coil 310, to a predetermined frequency (or $f_m$ in the case of the present embodiment) of an electromagnetic field that the main resonator 100 generates.

The shift frequency $f_s$ is determined based on the degree of coupling (K) between the main resonator coil 110 and the noise cancellation resonator coil 310. That is, the shift frequency $f_s$ is determined based on the mutual inductance $L_m$ between the main resonator coil 110 and the noise cancellation resonator coil 310. The above shift frequency $f_s$ is calculated by the following formula (1):

[Formula 1]

$$f_s = \frac{1}{2\pi\sqrt{L_m C_n}} \quad (1)$$

Accordingly, the resonance frequency $f_c$ of the noise cancellation resonator 300 is calculated by the following formula (2):

[Formula 2]

$$f_c = f_m + f_s \quad (2)$$

When the resonance frequency $f_c$ of the noise cancellation resonator 300 is set as described above, the main resonator coil 110 of the main resonator 100, which is a source of noise, is coupled to the noise cancellation resonator coil 310 under the magnetic wall condition. Accordingly, as shown in the frequency characteristics of noise emission of FIG. 2, the noise cancellation resonator 300 can efficiently cancel the noise emitted from the main resonator 100.

According to the above-described noise cancellation resonator 300 of the present invention, the effect of noise reduction is high particularly as a measure to deal with noise in the wireless power transmission system that uses the magnetic resonance antenna of the magnetic resonance method.

Incidentally, the noise cancellation resonator 300 of the present invention is passive with respect to noise. Therefore, it is desirable that the characteristics of the noise cancellation resonator 300 be almost the same as the level of an opposite-phase wave of noise. Moreover, it is desirable that the loss in the noise cancellation resonator 300 be reduced as much as possible. As a result of experiments, it was confirmed that the effect of noise reduction is high when the Q-value of the noise cancellation resonator 300 is 50 or more.

The frequencies of electromagnetic fields generated from the main resonator 100, which is a source of noise, include not only the fundamental wave but also noise components of higher harmonic waves of the fundamental wave. Accordingly, there is a need to remove the noise components by using the noise cancellation resonator 300.

As for the above higher harmonic waves, in a system that is likely to emit a higher harmonic wave whose frequency is an odd multiple of the frequency that is used to drive the main resonator 100, a higher harmonic wave that is calculated by the following formula (3) is generated from the main resonator 100. Therefore, the resonance frequency of the noise cancellation resonator 300 should be determined by the following formula (4).

[Formula 3]

$$f_{2n-1} = (2n-1)f_m \quad (3)$$

(n: natural number)

[Formula 4]

$$f = (2n-1)f_m + f_s \quad (4)$$

In a system that is likely to emit a higher harmonic wave whose frequency is an even multiple of the frequency that is used to drive the main resonator 100, a higher harmonic wave that is calculated by the following formula (5) is generated from the main resonator 100. Therefore, the resonance frequency of the noise cancellation resonator 300 should be determined by the following formula (6).

[Formula 5]

$$f_{2n} = 2nf_m \quad (5)$$

(n: natural number)

[Formula 6]

$$f_c = 2nf_m + f_s \quad (6)$$

As described above, the noise cancellation resonator coil 310 of the noise cancellation resonator 300 of the present invention is coupled to the main resonator coil 110 of the main resonator 100 under the magnetic wall condition. In this manner, the noise cancellation resonator coil 310 of the noise cancellation resonator 300 of the present invention is aimed at the noise reduction effect. This principle will be schematically described.

Figure 5:
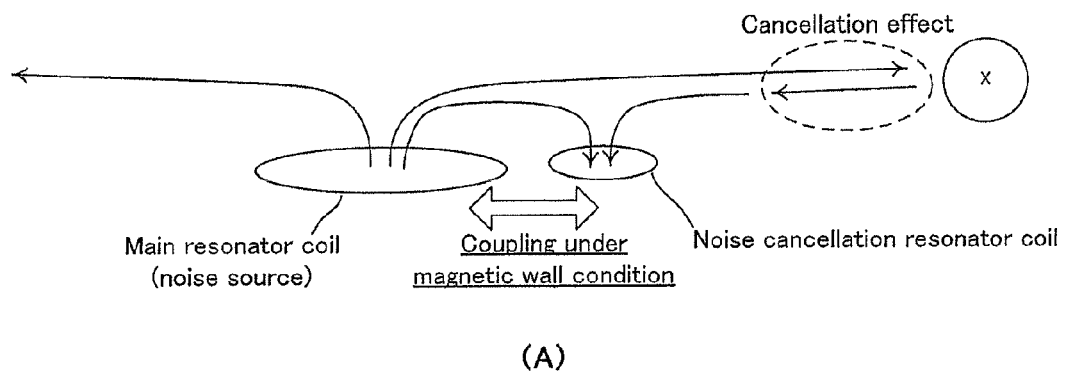
FIG. 5 is a conceptual diagram for explaining how the effect of noise reduction is improved by a noise cancellation resonator according to an embodiment of the present invention.
Figure 5:
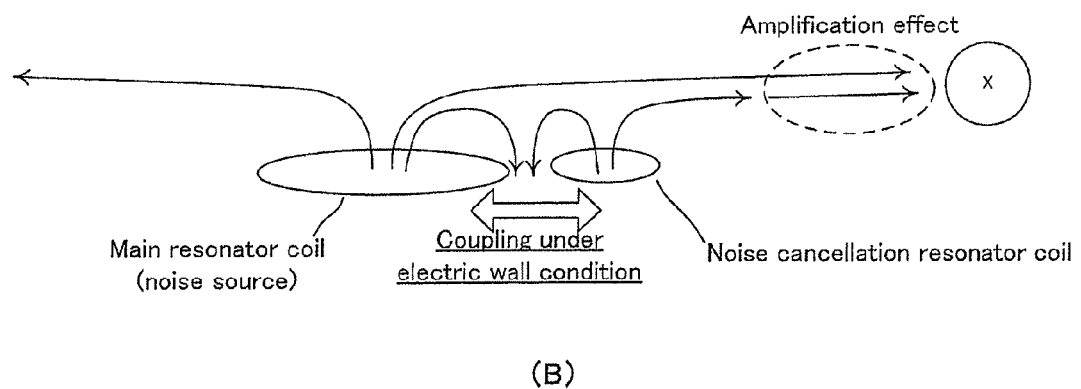

FIG. 5 is a conceptual diagram for explaining how the effect of noise reduction is improved by the noise cancellation resonator according to the embodiment of the present invention.

FIG. 5A shows the case where the main resonator coil 110 of the main resonator 100 is coupled to the noise cancellation resonator coil 310 of the noise cancellation resonator 300 under the magnetic wall condition. In this case, a magnetic field from the main resonator coil 110 is getting into the noise cancellation resonator coil 310. Given that, a magnetic field that is generated at point X is also expected to get into the noise cancellation resonator coil 310. As a result, as surrounded by dotted line, the magnetic field coming from the main resonator coil 110 and the magnetic field getting into the noise cancellation resonator coil 310 cancel each other. In this manner, the effect of noise cancellation will occur.

FIG. 5B shows the case where the main resonator coil 110 of the main resonator 100 is coupled to the noise cancellation resonator coil 310 of the noise cancellation resonator 300 under the electric wall condition. In this case, the magnetic field from the main resonator coil 110 and the magnetic field from the noise cancellation resonator 300 exclude each other. Given that, a magnetic field is expected to emerge in such a way as to get into point X. As a result, as surrounded by dotted line, the magnetic field coming from the main resonator coil 110 and the magnetic field coming from the noise cancellation resonator coil 310 boost each other. In this manner, the noise will be amplified.

Figure 6:
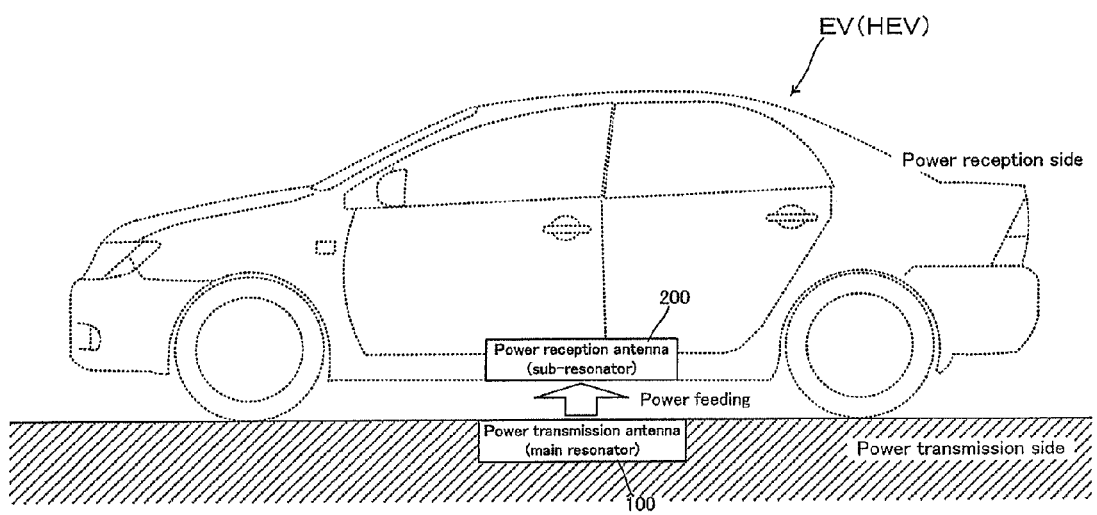
FIG. 6 is a schematic diagram showing an example in which a power transmission system that employs a main resonator and a sub-resonator is mounted on a vehicle.

An application example of the above-described noise cancellation resonator 300 of the present invention will be described. FIG. 6 is a schematic diagram showing an example in which a power transmission system that employs a main resonator 100 and a sub-resonator 200 is mounted on a vehicle.

What will be described below is an example in which the main resonator 100 and the sub-resonator 200 are a power transmission antenna and power reception antenna of the magnetic resonance method, respectively, and is a power transmission system in which power is wirelessly transmitted from the main resonator 100, which is a power transmission antenna, to the sub-resonator 200, which is a power reception antenna.

Such a power transmission system is suitably used as a system that is used to charge vehicle-mounted batteries, such as those of electric vehicles (EV) or hybrid electric vehicles (HEV), for example. In a bottom surface portion of a vehicle, the power reception antenna is disposed to receive power.

Since power is transmitted to the above vehicle in a non-contact manner, the system is provided in a parking space where the vehicle can be stopped. In the parking space, which is a vehicle charging space, the power transmission antenna of the power transmission system and the like are buried in the ground. A user of the vehicle stops the vehicle in the parking space where the power transmission system of the present embodiment is provided. From the power transmission antenna to the vehicle-mounted power reception antenna, electric energy is transmitted via an electromagnetic field.

In the above-described power transmission system, an electromagnetic field that leaks from the antenna during the transmission of power could leak from between the bottom surface of the vehicle and the ground. The leakage is not good for the environment and human body, and is therefore a problem. The noise cancellation resonator 300 of the present invention is disposed near the main resonator 100, which is a power transmission antenna. This configuration can reduce the above leakage, and can suppress the effect of the leakage of electromagnetic field on the environment and human body.

As described above, the noise cancellation resonator of the present invention is characterized by having a resonance frequency that is calculated by adding a shift frequency, which is determined based on the degree of coupling between the main resonator coil and the noise cancellation resonator coil, to a predetermined frequency of an electromagnetic field generated by the main resonator that is a source of noise and includes the main resonator coil. Therefore, the noise cancellation resonator of the present invention is highly effective in reducing noise particularly as a measure to deal with noise in the wireless power transmission system that uses the magnetic resonance antenna of the magnetic resonance method.

INDUSTRIAL APPLICABILITY

The power transmission system of the present invention is preferably used for a wireless power transmission system of a magnetic resonance method to charge vehicles such as electric vehicles (EV) and hybrid electric vehicles (HEV), which have become increasingly popular in recent years. However, in the wireless power transmission system of the magnetic resonance method, the problem is that, even if the resonance frequency of the noise cancellation resonator is set equal to the frequency of the noise source in order to deal with the noise, this setting may not be enough to reduce noise significantly.

The noise cancellation resonator of the present invention is characterized by having a resonance frequency that is calculated by adding a shift frequency, which is determined based on the degree of coupling between the main resonator coil and the noise cancellation resonator coil, to a predetermined frequency of an electromagnetic field generated by the main resonator that is a source of noise and includes the main resonator coil. Therefore, the noise cancellation resonator of the present invention is highly effective in reducing noise particularly as a measure to deal with noise in the wireless power transmission system that uses the magnetic resonance antenna of the magnetic resonance method. Therefore, the industrial applicability is very high.

EXPLANATION OF REFERENCE SYMBOLS

100: Main resonator
110: Main resonator coil
120: Main resonator capacitor
200: Sub-resonator
300: Noise cancellation resonator
310: Noise cancellation resonator coil
320: Noise cancellation resonator capacitor

The invention claimed is:
1. A noise cancellation resonator comprising:
a noise cancellation resonator coil with an inductance component of $L_n$; and
a noise cancellation resonator capacitor with a capacitance component of $C_n$, wherein
the noise cancellation resonator has a resonance frequency ($f_m+f_s$) that is calculated by adding a shift frequency ($f_s$), which is determined based on a degree of coupling between a main resonator coil and the noise cancellation resonator coil, to a predetermined frequency ($f_m$) of an electromagnetic field generated by a main resonator that is a source of noise and includes the main resonator coil.

2. The noise cancellation resonator according to claim 1, wherein
the predetermined frequency is a frequency of a fundamental wave of the electromagnetic field generated by the main resonator.

3. The noise cancellation resonator according to claim 1, wherein
the predetermined frequency is a frequency of a higher harmonic wave of the electromagnetic field generated by the main resonator.

4. The noise cancellation resonator according to claim 3, wherein
the higher harmonic wave is an odd-multiple wave.

5. The noise cancellation resonator according to claim 3, wherein
the higher harmonic wave is an even-multiple wave.

6. The noise cancellation resonator according to claim 1, wherein
if a mutual inductance component between the main resonator coil and the noise cancellation resonator coil is represented by $L_m$, the shift frequency is:

[Formula 1]

$$f_s = \frac{1}{2\pi\sqrt{L_m C_n}}.$$

7. The noise cancellation resonator according to claim 1, wherein
the main resonator is an antenna that is used to transmit power.

8. The noise cancellation resonator according to claim 1, wherein
a Q-value is 50 or more.

* * * * *